United States Patent
Shenoy et al.

(10) Patent No.: US 7,265,415 B2
(45) Date of Patent: Sep. 4, 2007

(54) MOS-GATED TRANSISTOR WITH REDUCED MILLER CAPACITANCE

(75) Inventors: Praveen Muraleedharan Shenoy, Wilkes Barre, PA (US); Christopher Boguslaw Kocon, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/962,367

(22) Filed: Oct. 8, 2004

(65) Prior Publication Data

US 2006/0076617 A1 Apr. 13, 2006

(51) Int. Cl.
*H01L 29/76* (2006.01)

(52) U.S. Cl. .................. 257/330; 257/340

(58) Field of Classification Search ........... 257/330, 257/331, 333, 340, 341
See application file for complete search history.

(56) References Cited

U.S. PATENT DOCUMENTS

| | | | |
|---|---|---|---|
| 3,404,295 A | 10/1968 | Warner et al. |
| 3,412,297 A | 11/1968 | Amlinger |
| 3,497,777 A | 2/1970 | Teszner et al. |
| 3,564,356 A | 2/1971 | Wilson |
| 3,660,697 A | 5/1972 | Berglund et al. |
| 4,003,072 A | 1/1977 | Matsushita et al. |
| 4,011,105 A | 3/1977 | Paivinen et al. |
| 4,300,150 A | 11/1981 | Colak |
| 4,324,038 A | 4/1982 | Chang et al. |
| 4,326,332 A | 4/1982 | Kenney et al. |
| 4,337,474 A | 6/1982 | Yukimoto |
| 4,345,265 A | 8/1982 | Blanchard |
| 4,445,202 A | 4/1984 | Geotze et al. |
| 4,568,958 A | 2/1986 | Baliga |

(Continued)

FOREIGN PATENT DOCUMENTS

CN 1036666 A 10/1989

(Continued)

OTHER PUBLICATIONS

Bai et al., "Novel automated optimization of power MOSFET for 12V input, high-frequency DC-DC converter," *International Symposium on Power Semiconductors and ICs, Technical Digest*, (2003), pp. 366-369, Apr. 2003.

(Continued)

*Primary Examiner*—Mark V. Prenty
(74) *Attorney, Agent, or Firm*—Townsend and Townsend and Crew LLP

(57) ABSTRACT

In one embodiment of the present invention, a trench MOS-gated transistor includes a first region of a first conductivity type forming a pn junction with a well region of a second conductivity type. The well region has a flat bottom portion and a portion extending deeper than the flat bottom portion. A gate trench extends into the well region. Channel regions extend in the well region along outer sidewalls of the gate trench. The gate trench has a first bottom portion which terminates within the first region, and a second bottom portion which terminates within the deeper portion of the well region such that when the transistor is in an on state the deeper portion of the well region prevents a current from flowing through those channel region portions located directly above the deeper portion of the well region.

23 Claims, 7 Drawing Sheets

U.S. PATENT DOCUMENTS

| | | |
|---|---|---|
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,673,962 A | 6/1987 | Chatterjee et al. |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,969,028 A | 11/1990 | Baliga |
| 4,974,059 A | 11/1990 | Kinzer |
| 4,990,463 A | 2/1991 | Morl |
| 4,992,390 A | 2/1991 | Chang |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,111,253 A | 5/1992 | Korman et al. |
| 5,134,448 A | 7/1992 | Johnsen et al. |
| 5,142,640 A | 8/1992 | Iwamatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,275,961 A | 1/1994 | Smayling et al. |
| 5,275,965 A | 1/1994 | Manning |
| 5,281,548 A | 1/1994 | Prall |
| 5,294,824 A | 3/1994 | Okada |
| 5,298,781 A | 3/1994 | Cogan et al. |
| 5,300,447 A | 4/1994 | Anderson |
| 5,300,452 A | 4/1994 | Chang et al. |
| 5,326,711 A | 7/1994 | Malhi |
| 5,346,834 A | 9/1994 | Hisamoto et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,541,425 A | 7/1996 | Nishihara |
| 5,554,552 A | 9/1996 | Chi |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi |
| 5,719,409 A | 2/1998 | Singh et al. |
| 5,744,372 A | 4/1998 | Bulucea |
| 5,767,004 A | 6/1998 | Balasubramanian et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,821,583 A | 10/1998 | Hshieh et al. |
| 5,877,528 A | 3/1999 | So |
| 5,879,971 A | 3/1999 | Witek |
| 5,879,994 A | 3/1999 | Kwan et al. |
| 5,894,157 A | 4/1999 | Han et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,907,776 A | 5/1999 | Hshieh et al. |
| 5,917,216 A | 6/1999 | Floyd et al. |
| 5,929,481 A | 7/1999 | Hsieh et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |

| | | | | | | |
|---|---|---|---|---|---|---|
| 5,977,591 | A | 11/1999 | Fratin et al. | 6,303,969 B1 | 10/2001 | Tan |
| 5,981,344 | A | 11/1999 | Hshieh et al. | 6,307,246 B1 | 10/2001 | Nitta et al. |
| 5,981,996 | A | 11/1999 | Fujishima | 6,309,920 B1 | 10/2001 | Laska et al. |
| 5,998,833 | A | 12/1999 | Baliga | 6,313,482 B1 | 11/2001 | Baliga |
| 6,005,271 | A | 12/1999 | Hshieh | 6,316,806 B1 | 11/2001 | Mo |
| 6,008,097 | A | 12/1999 | Yoon et al. | 6,326,656 B1 | 12/2001 | Tihanyi |
| 6,011,298 | A | 1/2000 | Blanchard | 6,337,499 B1 | 1/2002 | Werner |
| 6,015,727 | A | 1/2000 | Wanlass | 6,346,464 B1 | 2/2002 | Takeda et al. |
| 6,020,250 | A | 2/2000 | Kenny et al. | 6,346,469 B1 | 2/2002 | Greer |
| 6,034,415 | A | 3/2000 | Johnson et al. | 6,351,018 B1 | 2/2002 | Sapp |
| 6,037,202 | A | 3/2000 | Witek | 6,353,252 B1 | 3/2002 | Yasuhara et al. |
| 6,037,628 | A | 3/2000 | Huang | 6,359,308 B1 | 3/2002 | Hijzen et al. |
| 6,037,632 | A | 3/2000 | Omura et al. | 6,362,112 B1 | 3/2002 | Hamerski |
| 6,040,600 | A | 3/2000 | Uenishi et al. | 6,362,505 B1 | 3/2002 | Tihanyi |
| 6,048,772 | A | 4/2000 | D'Anna | 6,365,462 B2 | 4/2002 | Baliga |
| 6,049,108 | A | 4/2000 | Williams et al. | 6,365,930 B1 | 4/2002 | Schillaci et al. |
| 6,051,488 | A | 4/2000 | Lee et al. | 6,368,920 B1 | 4/2002 | Beasom |
| 6,057,558 | A | 5/2000 | Yamamoto et al. | 6,368,921 B1 | 4/2002 | Hijzen et al. |
| 6,063,678 | A | 5/2000 | D'Anna | 6,376,314 B1 | 4/2002 | Jerred |
| 6,064,088 | A | 5/2000 | D'Anna | 6,376,315 B1 | 4/2002 | Hshieh et al. |
| 6,066,878 | A | 5/2000 | Neilson | 6,376,878 B1 | 4/2002 | Kocon |
| 6,069,043 | A | 5/2000 | Floyd et al. | 6,376,890 B1 | 4/2002 | Tihanyi |
| 6,081,009 | A | 6/2000 | Neilson | 6,384,456 B1 | 5/2002 | Tihanyi |
| 6,084,264 | A | 7/2000 | Darwish | 6,388,286 B1 | 5/2002 | Baliga |
| 6,084,268 | A | 7/2000 | de Frésart et al. | 6,388,287 B2 | 5/2002 | Deboy et al. |
| 6,087,232 | A | 7/2000 | Kim et al. | 6,400,003 B1 | 6/2002 | Huang |
| 6,096,608 | A | 8/2000 | Williams | 6,426,260 B1 | 7/2002 | Hshieh |
| 6,097,063 | A | 8/2000 | Fujihira | 6,429,481 B1 | 8/2002 | Mo et al. |
| 6,103,578 | A | 8/2000 | Uenishi et al. | 6,433,385 B1 | 8/2002 | Kocon et al. |
| 6,104,054 | A | 8/2000 | Corsi et al. | 6,436,779 B2 | 8/2002 | Hurkx et al. |
| 6,110,799 | A | 8/2000 | Huang | 6,437,399 B1 | 8/2002 | Huang |
| 6,114,727 | A | 9/2000 | Ogura et al. | 6,441,454 B2 | 8/2002 | Hijzen et al. |
| 6,137,152 | A | 10/2000 | Wu | 6,452,230 B1 | 9/2002 | Boden, Jr. |
| 6,150,697 | A | 11/2000 | Teshigahara et al. | 6,461,918 B1 | 10/2002 | Calafut |
| 6,156,606 | A | 12/2000 | Michaelis | 6,465,304 B1 | 10/2002 | Blanchard et al. |
| 6,156,611 | A | 12/2000 | Lan et al. | 6,465,843 B1 | 10/2002 | Hirler et al. |
| 6,163,052 | A | 12/2000 | Liu et al. | 6,465,869 B2 | 10/2002 | Ahlers et al. |
| 6,165,870 | A | 12/2000 | Shim et al. | 6,472,678 B1 | 10/2002 | Hshieh et al. |
| 6,168,983 | B1 | 1/2001 | Rumennik et al. | 6,472,708 B1 | 10/2002 | Hshieh et al. |
| 6,168,996 | B1 | 1/2001 | Numazawa et al. | 6,475,884 B2 | 11/2002 | Hshieh et al. |
| 6,171,935 | B1 | 1/2001 | Nance et al. | 6,476,443 B1 | 11/2002 | Kinzer |
| 6,174,773 | B1 | 1/2001 | Fujishima | 6,479,352 B2 | 11/2002 | Blanchard |
| 6,174,785 | B1 | 1/2001 | Parekh et al. | 6,489,652 B1 | 12/2002 | Jeon et al. |
| 6,184,545 | B1 | 2/2001 | Werner et al. | 6,501,146 B1 | 12/2002 | Harada |
| 6,184,555 | B1 | 2/2001 | Tihanyi et al. | 6,534,825 B2 | 3/2003 | Calafut |
| 6,188,104 | B1 | 2/2001 | Choi et al. | 6,566,804 B1 | 5/2003 | Trujillo et al. |
| 6,188,105 | B1 | 2/2001 | Kocon et al. | 6,580,123 B2 | 6/2003 | Thapar |
| 6,190,978 | B1 | 2/2001 | D'Anna | 6,608,350 B2 | 8/2003 | Kinzer et al. |
| 6,191,447 | B1 | 2/2001 | Baliga | 6,657,254 B2 | 12/2003 | Hshieh et al. |
| 6,194,741 | B1 | 2/2001 | Kinzer et al. | 6,677,641 B2 | 1/2004 | Kocon |
| 6,198,127 | B1 | 3/2001 | Kocon | 6,683,346 B2 | 1/2004 | Zeng |
| 6,201,279 | B1 | 3/2001 | Pfirsch | 6,720,616 B2 | 4/2004 | Hirler et al. |
| 6,204,097 | B1 | 3/2001 | Shen et al. | 6,806,533 B2 | 10/2004 | Henninger et al. |
| 6,207,994 | B1 | 3/2001 | Rumennik et al. | 6,833,584 B2 | 12/2004 | Henninger et al. |
| 6,222,229 | B1 | 4/2001 | Hebert et al. | 6,930,352 B2 * | 8/2005 | Saito et al. .................. 257/330 |
| 6,222,233 | B1 | 4/2001 | D'Anna | 2001/0023961 A1 | 9/2001 | Hsieh et al. |
| 6,225,649 | B1 | 5/2001 | Minato | 2001/0026989 A1 | 10/2001 | Thapar |
| 6,228,727 | B1 | 5/2001 | Lim et al. | 2001/0028083 A1 | 10/2001 | Onishi et al. |
| 6,239,463 | B1 | 5/2001 | Williams et al. | 2001/0032998 A1 | 10/2001 | Iwamoto et al. |
| 6,239,464 | B1 | 5/2001 | Tsuchitani et al. | 2001/0041400 A1 | 11/2001 | Ren et al. |
| 6,265,269 | B1 | 7/2001 | Chen et al. | 2001/0049167 A1 | 12/2001 | Madson |
| 6,271,100 | B1 | 8/2001 | Ballantine et al. | 2001/0050394 A1 | 12/2001 | Onishi et al. |
| 6,271,552 | B1 | 8/2001 | D'Anna | 2002/0009832 A1 | 1/2002 | Blanchard |
| 6,271,562 | B1 | 8/2001 | Deboy et al. | 2002/0014658 A1 | 2/2002 | Blanchard |
| 6,274,904 | B1 | 8/2001 | Tihanyi | 2002/0066924 A1 | 6/2002 | Blanchard |
| 6,274,905 | B1 | 8/2001 | Mo | 2002/0070418 A1 | 6/2002 | Kinzer et al. |
| 6,277,706 | B1 | 8/2001 | Ishikawa | 2002/0100933 A1 | 8/2002 | Marchant |
| 6,281,547 | B1 | 8/2001 | So et al. | 2003/0060013 A1 | 3/2003 | Marchant |
| 6,285,060 | B1 | 9/2001 | Korec et al. | 2003/0132450 A1 | 7/2003 | Minato et al. |
| 6,291,298 | B1 | 9/2001 | Williams et al. | 2003/0193067 A1 | 10/2003 | Kim |
| 6,291,856 | B1 | 9/2001 | Miyasaka et al. | 2003/0209741 A1 * | 11/2003 | Saitoh et al. ................ 257/288 |
| 6,294,818 | B1 | 9/2001 | Fujihira | 2003/0209757 A1 | 11/2003 | Henninger et al. |
| 6,297,534 | B1 | 10/2001 | Kawaguchi et al. | 2004/0031987 A1 | 2/2004 | Henninger et al. |

| 2004/0089910 A1 | 5/2004 | Hirler et al. |
| 2004/0232407 A1 | 11/2004 | Calafut |
| 2005/0017293 A1 | 1/2005 | Zundel et al. |

FOREIGN PATENT DOCUMENTS

| DE | 4300806 C1 | 12/1993 |
| DE | 19736981 A1 | 8/1998 |
| EP | 0975024 A2 | 1/2000 |
| EP | 1026749 A1 | 8/2000 |
| EP | 1054451 A2 | 11/2000 |
| EP | 0747967 B1 | 2/2002 |
| EP | 1205980 A1 | 5/2002 |
| JP | 56058267 A | 5/1981 |
| JP | 62-069562 | 3/1987 |
| JP | 63-186475 | 8/1988 |
| JP | 63-288047 | 11/1988 |
| JP | 64-022051 | 1/1989 |
| JP | 01-192174 A | 8/1989 |
| JP | 05226638 A | 9/1993 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015448 | 1/2001 |
| JP | 2001-015752 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 A | 12/2001 |
| JP | 2002-083976 A | 3/2002 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/047171 A1 | 6/2002 |

OTHER PUBLICATIONS

Baliga "New Concepts in Power Rectifiers," Physics of Semiconductor Devices, Proceedings of the Third Int'l Workshop, Madras (India), Committee on Science and Technology in Developing Countries (1985), pp. 471-481, Nov. 1985.
Baliga "Options for CVD of Dielectrics Include Low-k Materials," Technical Literature from Semiconductor International, Jun. 1998, 4 pages total.
Baliga et al., "Improving the reverse recovery of power MOSFET integral diodes by electron irradiation," (Dec. 1983) Solid State Electronics, vol. 26, No. 12, pp. 1133-1141.
Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.
Bulucea "Trench DMOS Transistor Technology For High Current (100 A Range) Switching" Solid-State Electronics vol. 34 No. pp. 493-507 (May 1991).
Chang et al. "Numerical and experimental Analysis of 500-V Power DMOSFET with an Atomic-Lattice Layout," IEEE Transactions on Electron Devices 36:2623 (Jun. 1989).
Chang et al. "Self-Aligned UMOSFET's with a Specific On-Resistance of $1m\Omega\ cm^2$," IEEE Transactions on Electron Devices 34:2329-2334 (Nov. 1987).

Cheng et al., "Fast reverse recovery body diode in high-voltage VDMOSFET using cell-distributed schottky contacts," (May 2003) IEEE Transactions on Electron Devices, vol. 50, No. 5, pp. 1422-1425.
"CoolMOS™ the second generation," Infineon Technologies product information, (2000), 2 pages total.
Curtis, et al. "APCVD TEOS: 03 Advanced Trench Isolation Applications," Semiconductor Fabtech 9th Edition (1999) 8 pages total.
Darwish et al. A New Power W-Gated Trench MOSFET (WMOSFET) with High Switching Performance. ISPSD Proceedings—Apr. 2003, Cambridge, 4 pages total.
Djekic, O. et al., "High frequency synchronous buck converter for low voltage applications," (1998) Proc. IEEE Power Electronics Specialist Conf. (PESC), pp. 1248-1254.
Fujihira "Theory of Semiconductor Superjunction Devices" Jpn. J. Appl. Phys. vol. 36 pp. 6254-6262 (Oct. 1997).
Gan et al. "Poly Flanked VDMOS (PFVDMOS): A Superior Technology for Superjunction Devices," IEEE Power Electronics Specialists Conference, Jun. 17-22, 2001, Vancouver, Canada (2001), 4 pages total.
Glenn et al. "A Novel Vertical Deep Trench RESURF DMOS (VTR-DMOS)" IEEE ISPD 2000, May 22-25, Toulouse France, pp. 197-200, May 2000.
"IR develops CoolMOS™ -equivalent technology, positions it at the top of a 3-tiered line of new products for SMPS," International Rectifiers company information available at http://www.irf.com (1999) 3 pages total.
Kao et al. "Two Dimensional Thermal Oxidation of Silicon-I. Experiments,", IEEE Transactions on Electron Devices, vol. ED-34,No. 5, May 1987, pp. 1008-1017.
Kao et al. "Two Dimensional Thermal Oxidation of Silicon-II. Modeling Stress Effects in Wet Oxides," IEEE Transactions on Electron Devices, vol. ED-35, No. 1, Jan. 1988, pp. 25-37.
Kassakian, J.G. et al., "High-frequency high-density converters for distributed power supply systems," (Apr. 1988) Proceedings of the IEEE, vol. 76, No. 4, pp. 362-376.
Korman, C.S. et al., "High performance power DMOSFET with integrated schottky diode," (1989) Proc. IEEE Power Electronics Specialist Conf. (PESC), pp. 176-179.
Lorenz et al., "COOL MOS- An important milestone towards a new power MOSFET generation" Power Conversion pp. 151-160 (1988), May 1998.
Maksimovic, A.M. et al., "Modeling and simulation of power electronic converters," (Jun. 2001) Proceedings of the IEEE, vol. 89, No. 6, pp. 898-912.
Mehrotra, M. et al., "Very low forward drop JBS rectifiers fabricated using submicron technology," (Nov. 1993) IEEE Transactions on Electron Devices, vol. 40, No. 11, pp. 2131-2132.
Moghadam "Delivering Value Around New Industry Paradigms," Technical Literature from Applied Materials, pp. 1-11, vol. 1, Issue 2, Nov. 1999.
Park et al., "Lateral Trench Gate Super-Junction SOI-LDMOSFETs with Low On-Resistance," Institute for Microelectronics, University of Technology Vienna, Austria (2002), pp. 283-285.
Sakai et al., "Experimental investigation of dependence of electrical characteristics of device parameters in trench MOS barrier, schottky diodes," (1998) International Symposium on Power Semiconductors and ICs, Technical Digest, pp. 293-296.
Shenai et al., "Current transport mechanisms in atomically abrupt metal-semiconductor interfaces," (Apr. 1988) IEEE Transactions on Electron Devices, vol. 35, No. 4, pp. 468-482.
Shenai et al., "Monolithically integrated power MOSFET and schottky diode with improved reverse recovery characteristics," (Apr. 1990) IEEE Transactions on Electron Devices, vol. 37, No. 4, pp. 1167-1169.
Shenoy et al."Analysis of the Effect of Charge Imbalance on the Static and Dynamic Characteristic of the Super Junction MOSFET," IEEE International Symposium on Power Semiconductor Devices 1999, pp. 99-102 (1999).
Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) *Proc. IEEE Power Electronics Specialist Conf.* (PESC), pp. 769-779.

Tu et al. "On the reverse blocking characteristics of schottky power diodes," (Dec. 1992) *IEEE Transactions on Electron Devices*. vol. 39, No. 12, pp. 2813-2814 2 pages total.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf, "Silicon Processing for The VLSI Era" vol. 2 Process Integration Lattice Press (1990), 3 pages total.

Yamashita et al., Conduction Power loss in MOSFET synchronous rectifier with parallel-connected schottky barrier diode, (Jul. 1998) *IEEE Transactions on Power electronics*, vol. 13, No. 4, pp. 667-673.

* cited by examiner

MOS-GATED TRANSISTOR WITH REDUCED MILLER CAPACITANCE

BACKGROUND OF THE INVENTION

This invention relates in general to semiconductor power devices and in particular to a trench MOS-gated transistor with reduced miller capacitance.

FIG. 1 shows a simplified cross-section view of a conventional vertical trenched gate MOSFET 100. An epitaxial layer 104 of n-type conductivity type extends over n-type substrate 102 which forms the drain contact region. Well region 106 of p-type conductivity type is formed in an upper portion of epitaxial layer 104. Gate trench 109 extends through well region 106 and terminates just below the interface between epitaxial layer 104 and well region 106. Gate trench 109 is lined with a dielectric layer 112 along its sidewalls and bottom, and is filled with polysilicon material 110 forming the transistor gate. Source regions 108 flank each side of trench 109, and overlap gate 110 along the vertical dimension. In the on-state, a current flows vertically from drain terminal 114 to source terminal 116 through substrate 102, epitaxial layer 104, channel regions in well region 106 along the outer sidewalls of trench 109, and finally source regions 108.

Epitaxial layer 104 together with substrate 102 form the drain region. As can be seen, gate 110 overlaps the drain region along the bottom of trench 109. It is desirable to minimize this gate-drain overlap in order to improve the transistor switching speed. The gate-drain charge Qgd is proportional to this overlap area and inversely proportional to the thickness of the dielectric along the bottom of trench 109. Several methods to reduce Qgd have been proposed including reducing the trench width, using thicker dielectric along the trench bottom, eliminating portions of the gate along the trench flat bottom portion, and extending the p-type well region slightly deeper than the trench. Each of these techniques has its own advantages and disadvantages. Some require a more complex process technology, while others are not as effective in reducing Qgd without adversely impacting other device characteristics.

Thus, an MOS-gated transistor with improved characteristics including a substantially reduced miller capacitance, and which is simple to manufacture is desirable.

BRIEF SUMMARY OF THE INVENTION

In accordance with an embodiment of the present invention, a trench MOS-gated transistor includes a first region of a first conductivity type forming a pn junction with a well region of a second conductivity type. The well region has a flat bottom portion and a portion extending deeper than the flat bottom portion. A gate trench extends into the well region. Channel regions extend in the well region along outer sidewalls of the gate trench. The gate trench has a first bottom portion which terminates within the first region and a second portion which terminates within the deeper portion of the well region such that when the transistor is in an on state the deeper portion of the well region prevents a current from flowing through those channel region portions located directly above the deeper portion of the well region.

In accordance with another embodiment of the present invention, a trench MOS-gated transistor includes a silicon layer of a first conductivity type over a silicon substrate. A well region of a second conductivity type is formed in an upper portion of the silicon layer. A gate trench extends through the well region and terminates within the silicon layer. Source regions of the first conductivity type flank each side of the gate trench. The gate trench is filled with a polysilicon material at least up to and partially overlapping with the source regions. A silicon region of the second conductivity type extends along a bottom portion of the trench such that a gap is formed between the silicon region and the well region through which gap a current flows when the transistor is in an on state.

In accordance with another embodiment of the invention, a trench MOS-gated transistor is formed as follows. A first region of a first conductivity type is provided. A well region of a second conductivity type is then formed in an upper portion of the first region. A trench is formed which extends through the well region and terminates within the first region. Dopants of the second conductivity type are implanted along predefined portions of the bottom of the trench to form regions along the bottom of the trench which are contiguous with the well region such that when the transistor is in an on state the deeper portion of the well region prevents a current from flowing through those channel region portions located directly above the deeper portion of the well region.

In accordance with yet another embodiment of the invention, a trench MOS-gated transistor is formed as follows. An epitaxial layer of a first conductivity type is formed over a substrate. A well region of a second conductivity type is formed in an upper portion of the epitaxial layer. A trench is formed which extends through the well region and terminates within the epitaxial layer. Dopants of the second conductivity type are implanted along the bottom of the trench to form a region of the second conductivity type extending along a bottom portion of the trench such that a gap is formed between the region of the second conductivity type and the well region through which gap a current flows when the transistor is in an on state.

These and other embodiments of the invention will be described with reference to the accompanying drawings and following detailed description.

DETAILED DESCRIPTION OF THE INVENTION

In accordance with an embodiment of the invention, the gate-drain capacitance of a MOSFET is reduced by using an implant region under the trenched gate wherein the implant region is contiguous with the well region of the MOSFET.

The implant region makes the area of the trench under which it is formed inactive as it blocks conduction in the corresponding portion of the transistor channel. One suitable application for this embodiment would be high voltage devices in which the contribution of the channel resistance to the transistor on resistance Rdson is low. In another embodiment, an implant region under the gate trench is formed such that there is a gap between the implant region and the well region through which the channel current can flow. In this embodiment, the impact of the implant region on Rdson is minimized, and thus a suitable application for this embodiment would be low voltage devices. Both these embodiments are particularly useful in designs requiring a tight trench cell pitch such as tight alternating pn pillar pitch of a superjunction device or low Rdson. These two embodiments may be combined together in a single MOSFET. Alternatively, one of both of these embodiments may be combined with the prior art structure shown in FIG. 1 as needed.

Figure 2A:
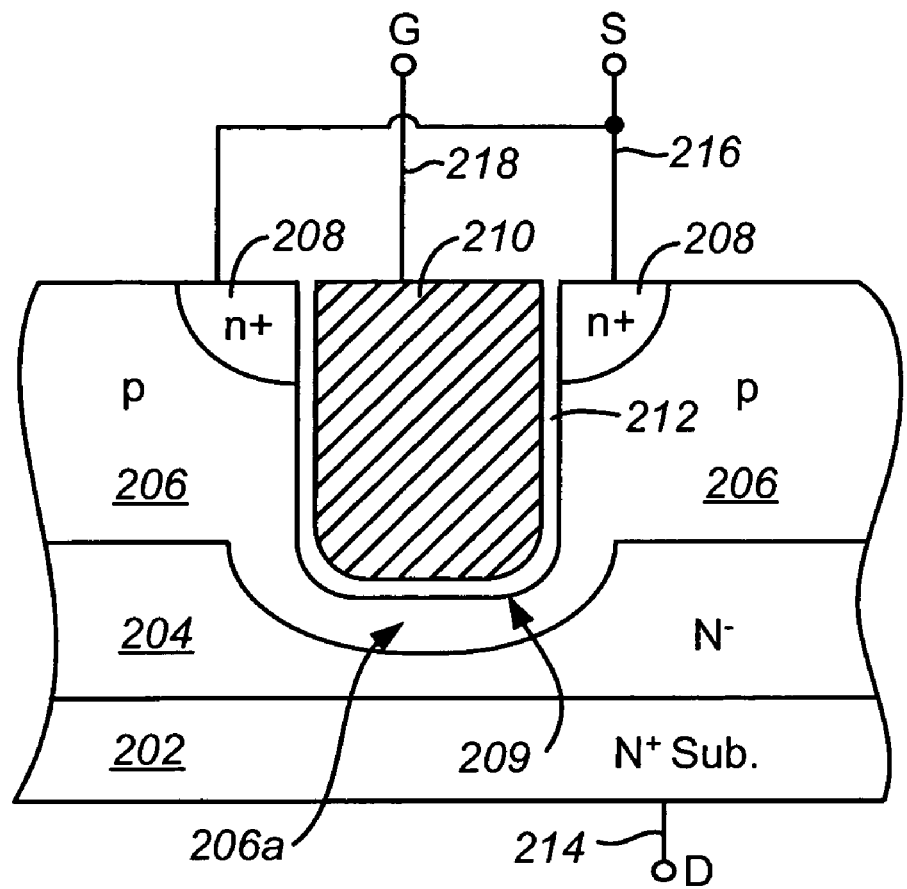
FIG. 2A shows a simplified cross section view of a vertical trenched-gate MOSFET in accordance with an embodiment of the present invention.

FIG. 2A shows a simplified cross section view of a vertical trenched-gate MOSFET 200 in accordance with an embodiment of the present invention. An epitaxial layer 204 of n-type conductivity type extends over n-type substrate 202 which forms the drain contact region. Well region 206 of p-type conductivity type is formed in an upper portion of epitaxial layer 204. Gate trench 209 extends through well region 206. A portion 206a of well region 206 directly below trench 209 extends deeper into epitaxial layer 204 than other portions of well region 206 such that gate trench 209 terminates within portion 206a. Gate trench 209 is lined with a dielectric layer 212 along its sidewalls and bottom. Trench 209 is filled with polysilicon material 210 forming the transistor gate. Source regions 208 flank each side of trench 209 and overlap gate 210 along the vertical dimension. In an alternate embodiment, trench 209 is partially filled with polysilicon material with dielectric material atop the polysilicon. Note that one or more of substrate 202, epitaxial layer 204, well region 206 including portion 206a, and source regions 208 may be from crystalline silicon (Si), silicon carbide (SiC), gallium nitride (GaN), or silicon germanium (SiGe).

In FIG. 2A, because gate 210 does not overlap epitaxial layer 204, no channel is formed above portion 206a in the on state. In one variation of the FIG. 2A embodiment, the trenched-gate cell is stripe shape (i.e., is laid out in an open cell configuration) as shown in the simplified top layout view in FIG. 2B. Stripe-shaped trenched-gate 210 extends vertically with source regions 208 flanking each side of trenched-gate electrode 210. As shown, deeper extending well portions 206a are formed periodically along a length of the striped trenched-gate electrode 210. Where portion 206a is not formed (e.g., along dashed line 1-1) the cell cross section is similar to that in FIG. 1 (i.e., gate trench 210 extends clear through well region 206 and terminates within epitaxial layer 204 such the gate trench overlaps epitaxial layer 204 along the vertical dimension). In this manner, in the on state, current flow is established (in a similar manner to that described above in reference to FIG. 1) along those portions of the trench sidewalls below which deeper extending well portions 206a are not formed. Current flow is however blocked where deeper extending well portions 206a are formed under the gate. The gate-drain overlap is thus reduced by an amount corresponding to portions 206a. Further, since the total well region 206 is increased in size, the gate to source capacitance or Qgs increases. Thus, the Qgd/Qgs ratio advantageously decreases further. The switching characteristics of the MOSFET are therefore substantially improved.

In one embodiment, the FIG. 2A structure is formed as follows. Epitaxial layer 204 is formed over substrate 202 using conventional techniques. Well region 206 is formed in an upper portion of epitaxial layer 204 by implanting and driving in p-type dopants using known techniques. Trench 209 is then formed by etching the silicon using conventional silicon etch techniques. Using a masking layer, the bottom of trench 209 is then selectively implanted with p-type dopants to thus form regions 206a. In one embodiment, an implant dose in the range of $1\times10^{13}$-$1\times10^{14}$ cm$^{-3}$ and an implant energy in the range of 40-120 KeV are used. In another embodiment, the thickness of region 206a at its deepest point is in the range of 0.2-0.41 μm. Dielectric layer 212, doped polysilicon 2210 filling trench 209, and source regions 208 are all formed using conventional methods.

Figure 3:
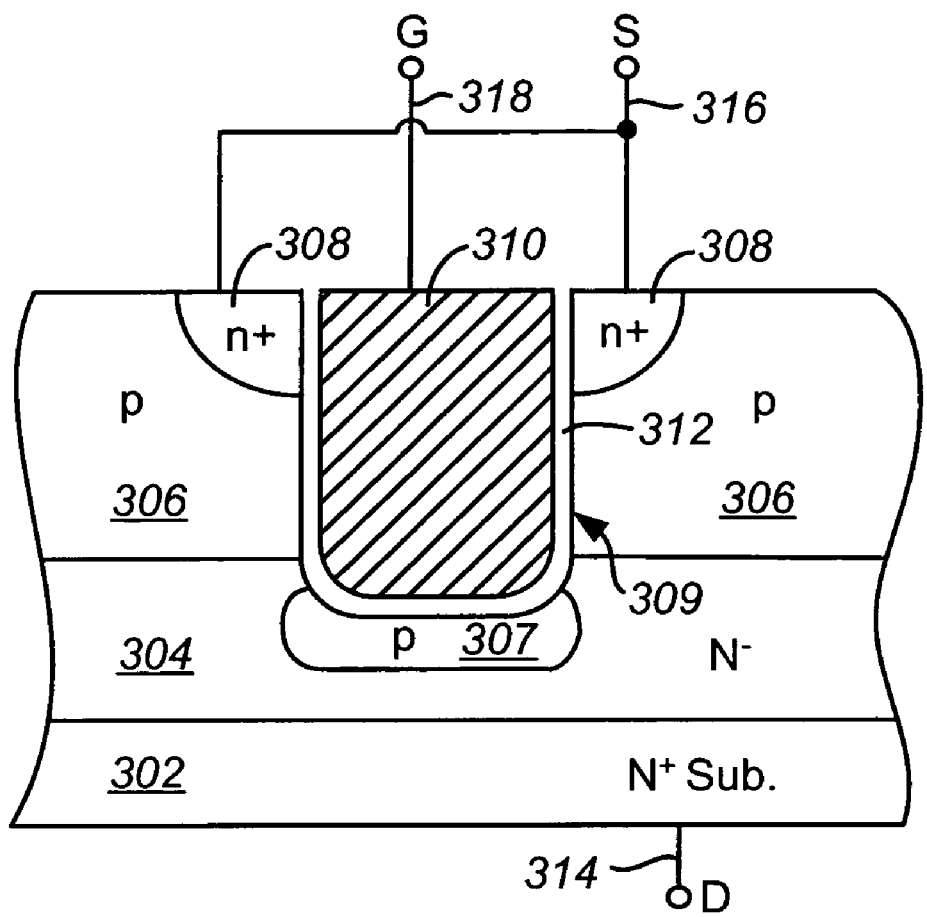
FIG. 3 shows a simplified cross section view of a vertical trenched-gate MOSFET in accordance with another embodiment of the present invention.

FIG. 3 shows a simplified cross section view of a vertical trenched-gate MOSFET 300 in accordance with another embodiment of the present invention. Cross section view of MOSFET 300 is similar to that in FIG. 2A except that instead of the deeper extending well portion 206a, p-type region 307 is formed directly below trench 309. As shown in FIG. 3, region 307 is formed such that there is a gap between well region 306 and region 307 at each of the bottom corners of trench 309. During the on state, current flows through these gaps. Thus, by using region 307 with gaps as shown, the gate-drain overlap is significantly reduced without blocking the current flow. In one embodiment, region 307 is formed by carrying out a shallow boron implant through the bottom the trench using an implant energy in the range of 30-80 KeV. In one embodiment, region 307 has a thickness in the range of 0.1-0.3 μm, and the gap between region 307 and well region 306 is in the range of 0.1-0.3 μm. As in the FIG. 2A embodiment, one or more of substrate 302, epitaxial layer 304, well region 306, region 307, and source regions 308 may be from crystalline silicon (Si), silicon carbide (SiC), gallium nitride (GaN), or silicon germanium (SiGe).

Figure 1:
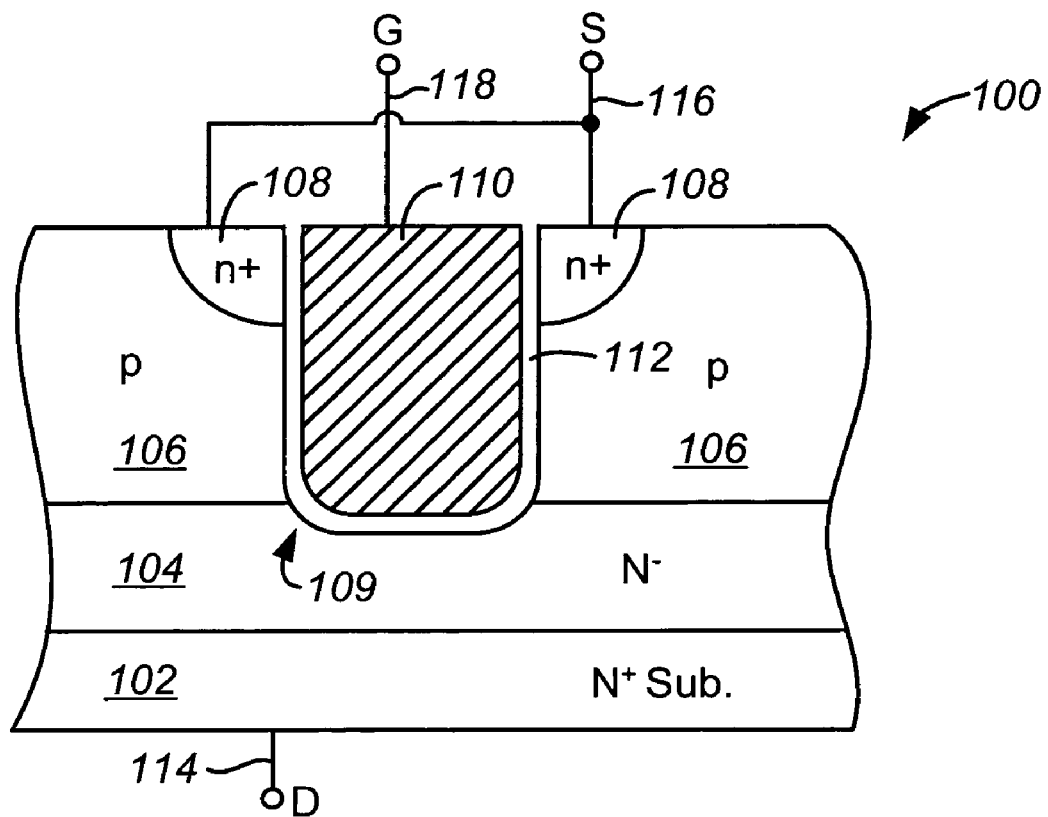
FIG. 1 shows a simplified cross-section view of a conventional vertical trenched gate MOSFET.
Figure 2B:
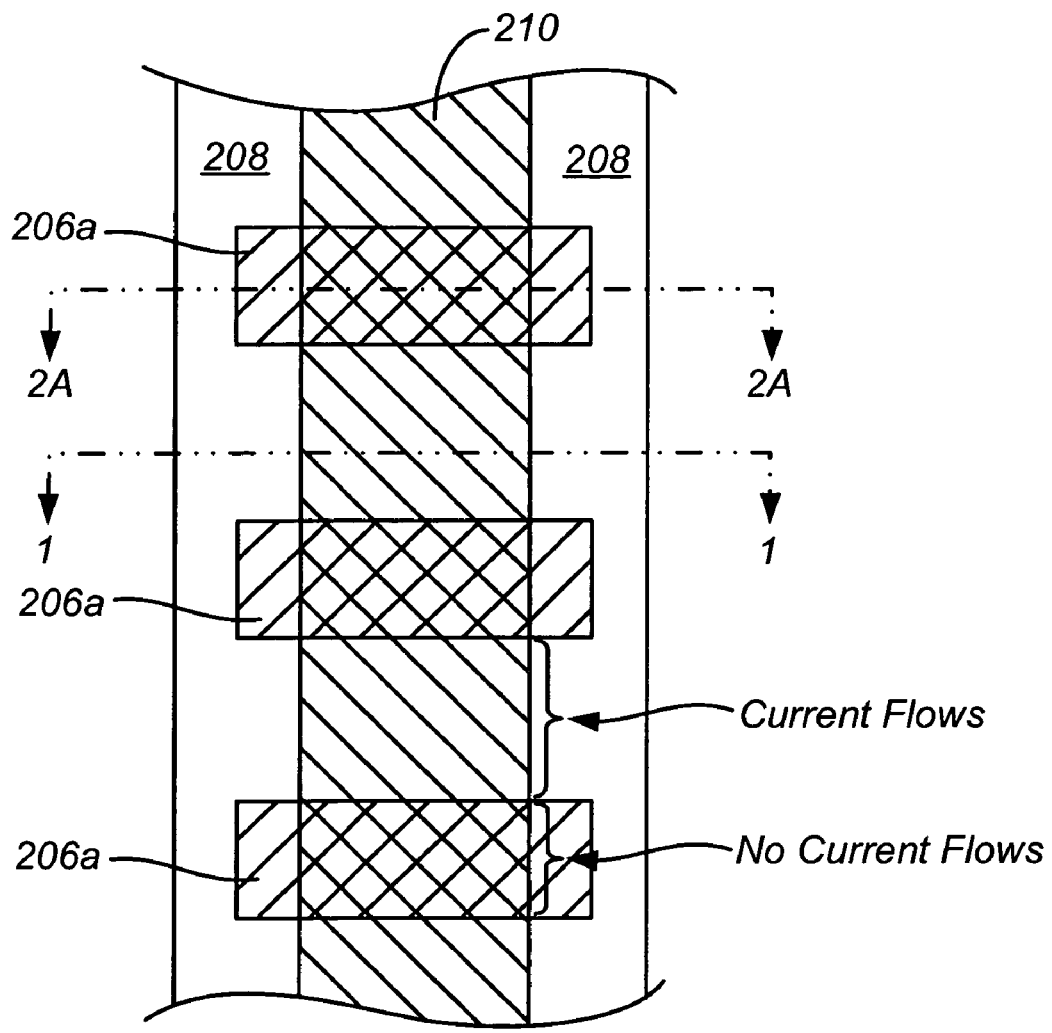
FIG. 2B shows a simplified top layout view of the vertical trenched-gate MOSFET in FIG. 2A.
Figure 4:
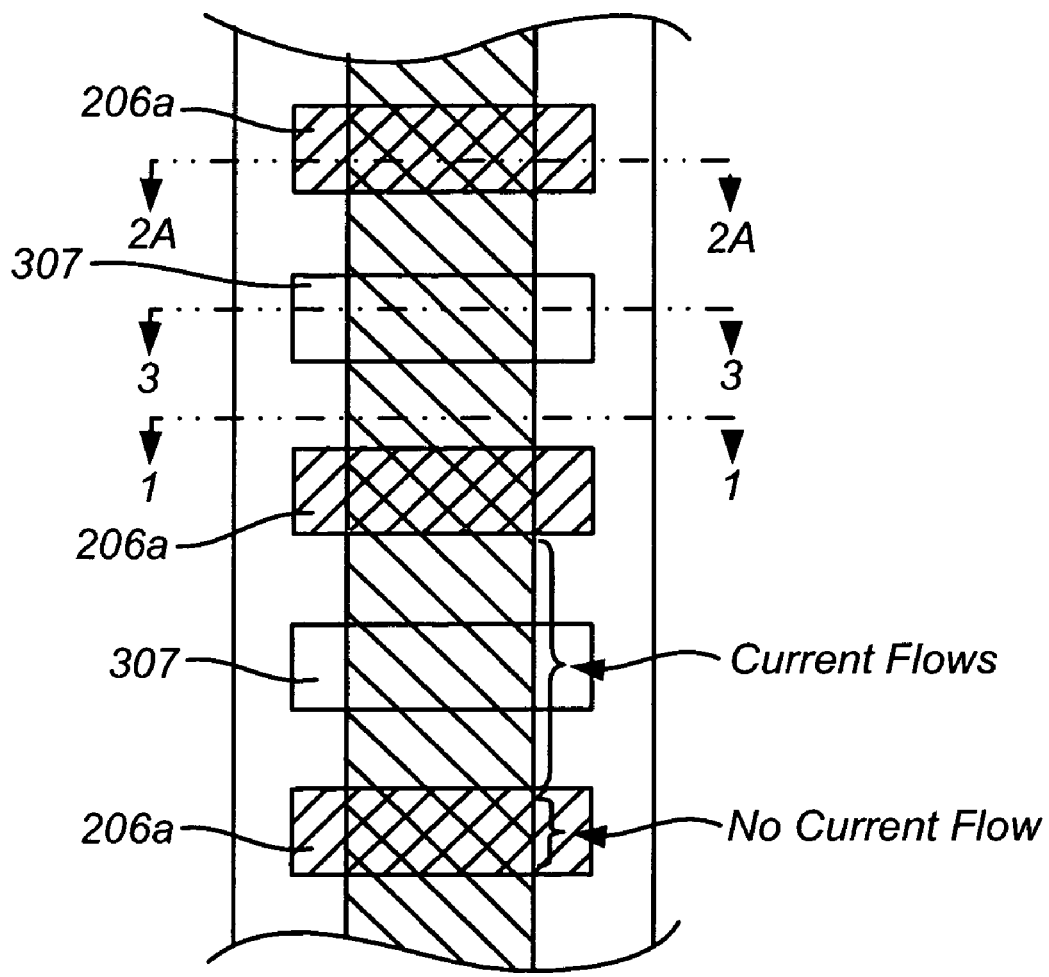
FIG. 4 shows a simplified top layout view of an alternate embodiment of the present invention wherein the cell structures in FIGS. 2A and 3 are combined.

In the stripe-shaped cell layout embodiment, region 307 may be continuous along the length of the striped trench gate. Region 307 may be extended up at the ends of or other locations along the striped trench gate to electrically contact well region 306. Alternatively, region 307 is not biased and thus is allowed to electrically float. In an alternate embodiment, similar to the layout shown in FIG. 2B, a number of p-type regions 307 are formed periodically along the length of the stripe such that the cell structure along portions of the stripe (e.g., at dashed line 1-1) is similar to that in prior art FIG. 1. Alternatively, the FIG. 2A and FIG. 3 embodiments may be combined as shown in the layout diagram in FIG. 4. In FIG. 4, regions 206a correspond to region 206a in FIG. 2A and regions 307 correspond to region 307 in FIG. 3. As indicated by the two arrows, no current conduction occurs where regions 206a are formed, but current can flow where regions 307 are formed as well as between regions 206a and 307. The particular arrangement of regions 307 and 206a is not limited to that shown in FIG. 4. Many other arrangements are possible. In yet another embodiment, the regions between regions 206a and 307 are eliminated such that nowhere along the stripe is a cell structure similar to that shown in the prior art FIG. 1 is formed.

In one embodiment of the invention, the well region 206 and region 206a under the gate trench in FIG. 2A, and the well region 306 and the region 307 under the gate trench in FIG. 3 may be formed as follows. A shallow blanket implant (in the active region) of p-type dopants into the epitaxial layer is carried out. A deep implant of p-type dopants into selected areas of the epitaxial layer is then carried out using a masking layer. These two implant steps may be carried out in reverse order. A temperature cycle is then carried out to drive both implanted dopants deeper into the epitaxial layer. As a result, a well region corresponding to the shallow blanket implant and predefined silicon regions corresponding to the deep implant are formed in the epitaxial layer such that the deepest portion of the predefined silicon regions is deeper than a bottom surface of the well region. To obtain the structure in FIG. 2A, the above two implant steps and the temperature cycle need to be designed so that after driving in the dopants, the silicon regions are contiguous with the well regions. Alternatively, to form the structure in FIG. 3, the two implant steps and the temperature cycle need to be designed so that after the dopants are driven in and the gate trench is formed, a gap is formed between each of the silicon regions and the well region. In view of this disclosure, one skilled in the art would know how to design the two implant steps and the temperature cycle in order to obtain the structures shown in FIGS. 2A and 3.

In another method of forming the well region 206 and region 206a under the gate trench in FIG. 2A, and the well region 306 and the region 307 under the gate trench in FIG. 3, a shallow implant of p-type dopants into selected areas of the epitaxial layer is first carried out using a masking layer. A temperature cycle is then performed to drive the implanted dopants deeper into the epitaxial layer. A blanket implant (in the active region) of p-type dopants into the first silicon region is then carried out. A second temperature cycle is then performed to drive the implanted dopants from the blanket implant step deeper into the epitaxial layer and to drive the dopants from the shallow implant step even deeper into the epitaxial layer. As a result, a well region corresponding to the blanket implant and silicon regions corresponding to the shallow implant are formed such that the deepest portion of the silicon regions is deeper than a bottom surface of the well region. To obtain the structure in FIG. 2A, the above two implant steps and two temperature cycles need to be designed so that after driving in the dopants the silicon regions are contiguous with the well regions. Alternatively, to form the structure in FIG. 3, the two implant steps and the two implant steps need to be designed so that after the dopants are driven in and the gate trench is formed, a gap is formed between each of the silicon regions and the well region. As with the preceding embodiment, in view of this disclosure, one skilled in the art would know how to design the two the implant steps and the two temperature cycles in order to obtain the structures shown in FIGS. 2A and 3.

The table below shows the simulation results for Qgs, Qgd, and Qgd/Qgs ratio for each of MOSFET 100 in prior art FIG. 1, MOSFET 200 in FIG. 2A, and MOSFET 300 in FIG. 3. A 600V superjunction MOSFET with a 6 μm pitch and 0.6 μm trench width was used for the simulation.

| Parameter | FIG. 1 | FIG. 2A | FIG. 3 |
| --- | --- | --- | --- |
| Qgs nC/cm$^2$ | 72.8 | 103.8 | 73.2 |
| Qgd nC/cm$^2$ | 36.4 | 27.3 | 31.6 |
| Qgd/Qgs | 0.50 | 0.26 | 0.43 |

Figure 5:
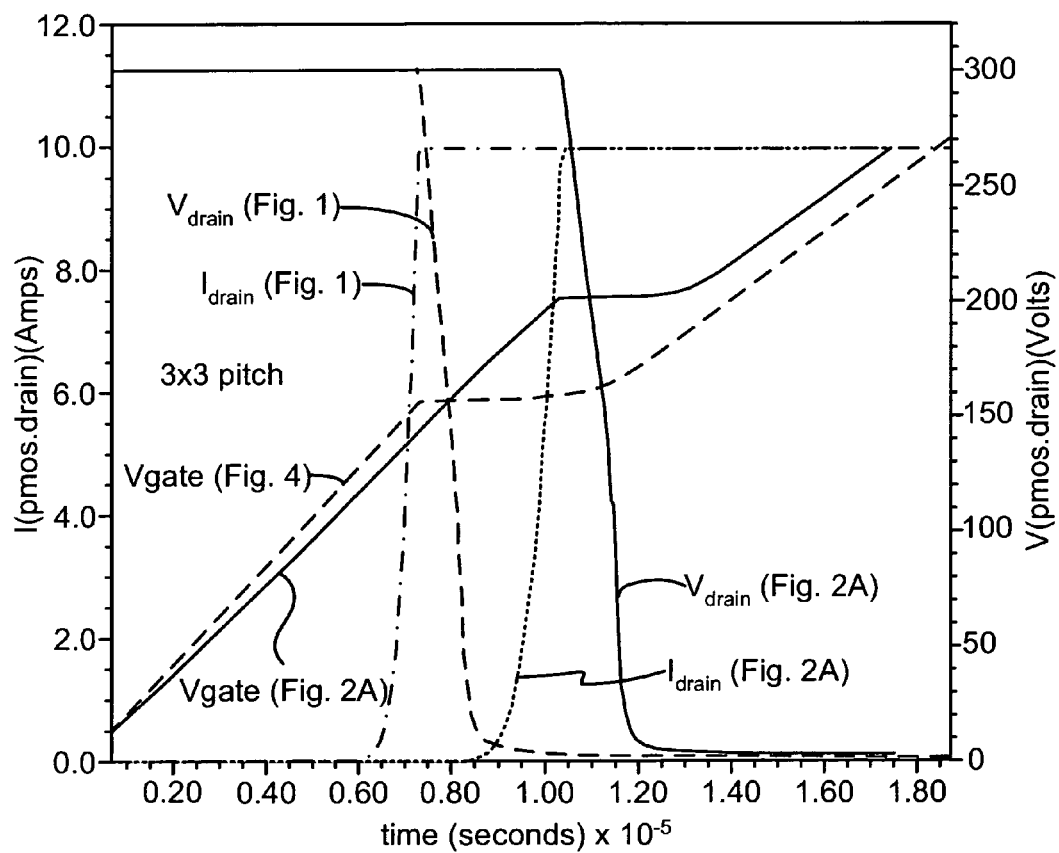
FIG. 5 shows the current and voltage waveforms for the FIG. 2A MOSFET embodiment versus those for the prior art FIG. 1 MOSFET.
Figure 6:
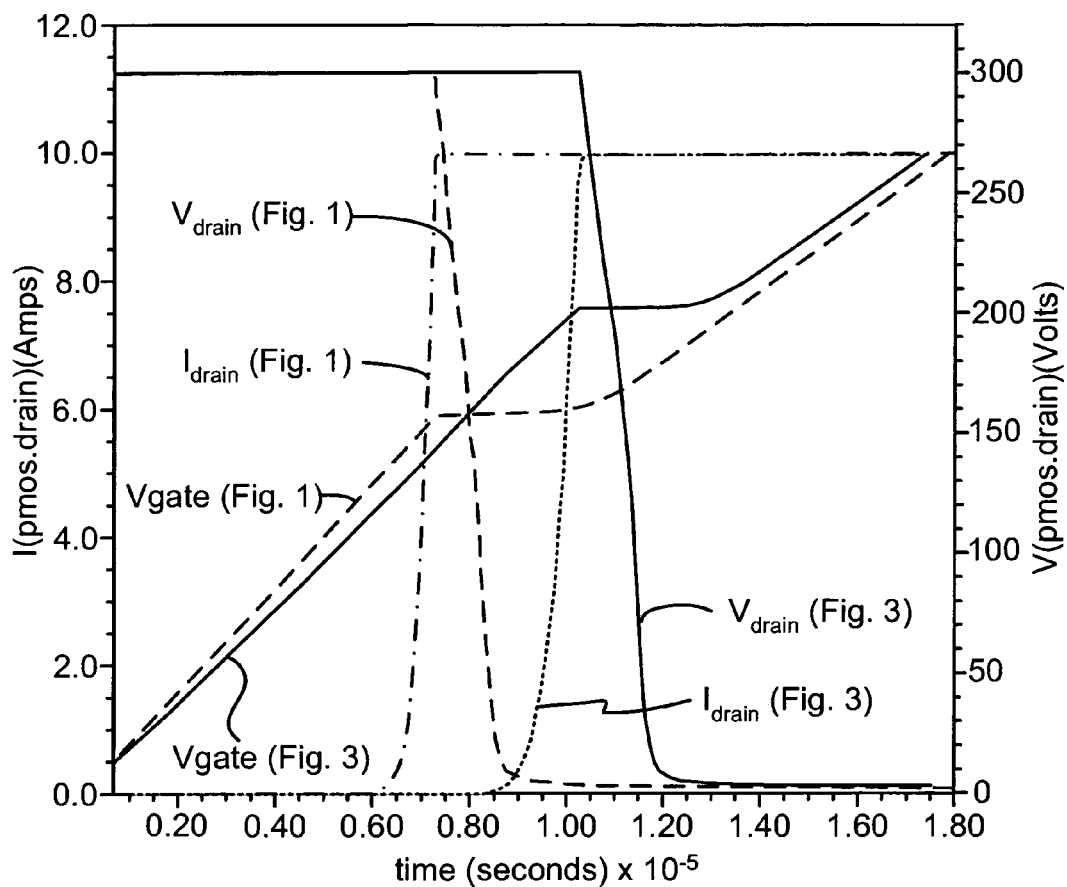
FIG. 6 shows current and voltage waveforms for the FIG. 3 MOSFET versus those for the prior art FIG. 1 MOSFET.

As can be seen MOSFETS 200 and 300 both have lower Qgd than prior art MOSFET 100, and both have higher Qgs than prior art MOSFET 100. A lower Qgd/Qgs ratio is thus obtained for both MOSFETs 200 and 300 than that for MOSFET 100. The simulation waveforms in FIGS. 5 and 6 show similar results. FIG. 5 shows the Idrain, Vdrain, and Vgate for the FIG. 2A MOSFET and for the prior art FIG. 1 MOSFET, and FIG. 6 shows the same parameters for the FIG. 3 MOSFET and the prior art FIG. 1 MOSFET.

The cross-section views and top layout view of the different embodiments may not be to scale, and as such are not intended to limit the possible variations in the layout design of the corresponding structures. Also, the various transistors can be formed in cellular architecture including hexagonal or square shaped transistor cells.

Although a number of specific embodiments are shown and described above, embodiments of the invention are not limited thereto. For example, it is understood that the doping polarities of the structures shown and described could be reversed and/or the doping concentrations of the various elements could be altered without departing from the invention. As another example, the various exemplary vertical transistors described above have the trenches terminating in the drift regions, but they can also terminate in the more heavily doped substrate. As yet another example, the present invention is shown and described in the context of vertical MOSFET embodiments, but regions 206a in FIG. 2A and 307 in FIG. 3 can be similarly formed in other trenched gate structures such as trenched gate IGBTs and lateral trenched gate MOSFETs.

Therefore, the scope of the present invention should be determined not with reference to the above description but should, instead, be determined with reference to the appended claim, along with their full scope of equivalents.

What is claimed is:

1. A trench MOS-gated transistor comprising:
   a first region of a first conductivity type;
   a well region of a second conductivity type forming a pn junction with the first region, the well region having a flat bottom portion and a portion extending deeper than the flat bottom portion, wherein the deeper portion of the well region, at its deepest point, is about 0.2-0.4 μm deeper than the flat bottom portion;
   a gate trench extending into the well region; and
   channel regions in the well region along outer sidewalls of the gate trench, wherein a first bottom portion of the gate trench terminates within the first region and a second bottom portion of the gate trench terminates within the deeper portion of the well region such that when the transistor is in an on state the deeper portion of the well region prevents a current from flowing through those channel region portions located directly above the deeper portion of the well region.

2. The trench MOS-gated transistor of claim 1 further comprising:
   a substrate of the first conductivity type, wherein the first region is an epitaxial layer extending over the substrate.

3. The trench MOS-gated transistor of claim 1 further comprising:
   source regions of the first conductivity type in the well region, the source regions flanking each side of the gate trench.

4. The trench MOS-gated transistor of claim 1 wherein the gate trench comprises a dielectric layer lining the sidewalls and bottom of the gate trench, and the gate trench is at least partially filled with polysilicon.

5. The trench MOS-gated transistor of claim 1 further comprising a second region of the second conductivity type in the first region, a third bottom portion of the gate trench terminating within the second region, the second region being spaced from the well region to form a gap therebetween, wherein a current flows through the gap when the transistor is in an on state.

6. The trench MOS-gated transistor of claim 1 wherein at least one of the first region and the well region is from one of crystalline silicon (Si), silicon carbide (SiC), gallium nitride (GaN), and silicon germanium (SiGe).

7. A trench MOS-gated transistor comprising:
a substrate;
an epitaxial layer of a first conductivity type extending over and in contact with the substrate;
a well region of a second conductivity type formed in an upper portion of the epitaxial layer, the well region having a flat bottom portion and a plurality of portions extending deeper than the flat bottom portion, wherein the plurality of deeper portions of the well region, at their deepest point, are about 0.2-0.4 µm deeper than the flat bottom portion;
a plurality of gate trenches extending into the well region; and
source regions of the first conductivity type formed in an upper portion of the well region, the source regions flanking each side of the plurality of gate trenches so as to form channel regions in the well region along outer sidewalls of each of the plurality of gate trenches, each of the plurality of gate trenches having a first plurality of bottom portions which extend through the well region and terminate within the epitaxial layer and a second plurality of bottom portions each terminating within a corresponding one of the plurality of deeper portions of the well region such that when the transistor is in an on state the plurality of deeper portions of the well region prevent a current from flowing through those channel region portions located directly above the deeper portions of the well region.

8. The trench MOS-gated transistor of claim 7 further comprising a plurality of regions of the second conductivity type in the epitaxial layer, a third plurality of bottom portions of each gate trench terminating within a corresponding one of the plurality of regions of the second conductivity type, the plurality of regions of the second conductivity type being spaced from the well region to form a gap therebetween, wherein a current flows through the gap when the transistor is in an on state.

9. The trench MOS-gated transistor of claim 7 wherein each of the plurality of gate trenches comprises a dielectric layer lining the sidewalls and bottom of the gate trench, and each gate trench is at least partially filled with polysilicon.

10. The trench MOS-gated transistor of claim 7 wherein at least one of the substrate, the epitaxial layer, the well region, and the source regions is from one of crystalline silicon (Si), silicon carbide (SiC), gallium nitride (GaN), and silicon germanium (SiGe).

11. A trench MOS-gated transistor comprising:
a substrate of silicon material;
a layer of silicon material of a first conductivity type over the substrate;
a well region of a second conductivity type formed in an upper portion of the layer of silicon material;
a gate trench extending into the well region, the gate trench having a first bottom portion and a second bottom portion, the second bottom portion terminating within the layer of silicon material;
a source region of the first conductivity type flanking each side of the gate trench so as to form channel regions in the well region along outer sidewalls of the gate trench, the gate trench being filled with a polysilicon material at least up to and partially overlapping with the source regions; and
a region of silicon material of the second conductivity type surrounding only the first bottom portion of the gate trench such that a gap is formed between the region of silicon material and the well region through which gap a current flows when the transistor is in an on state, wherein the region of silicon material electrically floats.

12. The trench MOS-gated transistor of claim 11 wherein the layer of silicon material is an epitaxial layer extending over the substrate.

13. The trench MOS-gated transistor of claim 11 wherein the region of silicon material has a thickness in the range of 0.1-0.3 µm.

14. The trench MOS-gated transistor of claim 11 wherein the gate trench is stripe shaped and the region of silicon material partially extends along a length of the striped gate trench.

15. The trench MOS-gated transistor of claim 11 wherein the well region has a flat bottom portion and a portion extending deeper than the flat bottom portion such that portions of the gate trench terminate within the deeper portion of the well region.

16. A trench MOS-gated transistor comprising:
a first region of a first conductivity type;
a well region of a second conductivity type forming a pn junction with the first region, the well region having a flat bottom portion and a portion extending deeper than the flat bottom portion;
a gate trench extending into the well region;
channel regions in the well region along outer sidewalls of the gate trench, wherein a first bottom portion of the gate trench terminates within the first region and a second bottom portion of the gate trench terminates within the deeper portion of the well region such that when the transistor is in an on state the deeper portion of the well region prevents a current from flowing through those channel region portions located directly above the deeper portion of the well region; and
a second region of the second conductivity type in the first region, a third bottom portion of the gate trench terminating within the second region, the second region being spaced from the well region to form a gap therebetween, wherein a current flows through the gap when the transistor is in an on state.

17. The trench MOS-gated transistor of claim 16 further comprising:
a substrate of the first conductivity type, wherein the first region is an epitaxial layer extending over the substrate.

18. The trench MOS-gated transistor of claim 16 further comprising:
a dielectric layer lining the sidewalls and bottom of the gate trench,
gate polysilicon at least partially filling the gate trench; and
source regions of the first conductivity type in the well region, the source regions flanking each side of the gate trench.

19. The trench MOS-gated transistor of claim 16 wherein at least one of the first region and the well region is from one of crystalline silicon (Si), silicon carbide (SiC), gallium nitride (GaN), and silicon germanium (SiGe).

20. A trench MOS-gated transistor comprising:
a substrate of silicon material;
a layer of silicon material of a first conductivity type over the substrate;
a well region of a second conductivity type formed in an upper portion of the layer of silicon material;
a gate trench extending into the well region;
a source region of the first conductivity type flanking each side of the gate trench so as to form channel regions in the well region along outer sidewalls of the gate trench, the gate trench being filled with a polysilicon material at least up to and partially overlapping with the source regions; and
a region of silicon material of the second conductivity type surrounding a bottom portion of the gate trench such that a gap is formed between the region of silicon material and the well region through which gap a current flows when the transistor is in an on state, wherein the region of silicon material has a thickness in the range of 0.1-0.3 μm.

21. The trench MOS-gated transistor of claim 20 wherein the gate trench is stripe shaped and the region of silicon material extends along an entire length of the striped gate trench.

22. A trench MOS-gated transistor comprising:
a substrate of silicon material;
a layer of silicon material of a first conductivity type over the substrate;
a well region of a second conductivity type formed in an upper portion of the layer of silicon material;
a gate trench extending into the well region;
a source region of the first conductivity type flanking each side of the gate trench so as to form channel regions in the well region along outer sidewalls of the gate trench, the gate trench being filled with a gate electrode at least up to and partially overlapping with the source regions; and
a region of silicon material of the second conductivity type surrounding a bottom portion of the gate trench such that a gap is formed between the region of silicon material and the well region through which gap a current flows when the transistor is in an on state, wherein the gate trench is stripe shaped and the region of silicon material extends along an entire length of the striped gate trench, and wherein the region of silicon material is electrically connected to the well region.

23. A trench MOS-gated transistor comprising:
a substrate of silicon material;
a layer of silicon material of a first conductivity type over the substrate;
a well region of a second conductivity type formed in an upper portion of the layer of silicon material;
a gate trench extending into the well region;
a source region of the first conductivity type flanking each side of the gate trench so as to form channel regions in the well region along outer sidewalls of the gate trench, the gate trench being filled with a gate electrode at least up to and partially overlapping with the source regions; and
a region of silicon material of the second conductivity type surrounding a bottom portion of the gate trench such that a gap is formed between the region of silicon material and the well region through which gap a current flows when the transistor is in an on state,
wherein the well region has a flat bottom portion and a portion extending deeper than the flat bottom portion such that portions of the gate trench terminate within a middle region of the deeper portion of the well region, and wherein the region of silicon material electrically floats.

* * * * *